(12) United States Patent　　(10) Patent No.: US 8,824,206 B2
Oishi et al.　　(45) Date of Patent: Sep. 2, 2014

(54) NON-VOLATILE SEMICONDUCTOR MEMORY DEVICE AND READOUT METHOD THEREOF

(71) Applicant: Powerchip Technology Corporation, Hsin-Chu (TW)

(72) Inventors: Masayuki Oishi, Tokyo (JP); Nobuhiko Ito, Tokyo (JP)

(73) Assignee: Powerchip Technology Corporation, Hsin-Chu (TW)

( * ) Notice: Subject to any disclaimer, the term of this patent is extended or adjusted under 35 U.S.C. 154(b) by 41 days.

(21) Appl. No.: 13/677,796

(22) Filed: Nov. 15, 2012

(65) Prior Publication Data

US 2014/0022845 A1　Jan. 23, 2014

(30) Foreign Application Priority Data

Jul. 18, 2012　(JP) ................................ 2012-159685

(51) Int. Cl.
*G11C 16/04*　(2006.01)
*G11C 16/26*　(2006.01)

(52) U.S. Cl.
CPC ............ *G11C 16/26* (2013.01); *G11C 16/0483* (2013.01)
USPC .............. 365/185.11; 365/185.17; 365/185.18

(58) Field of Classification Search
CPC ......... G11C 16/08; G11C 16/10; G11C 16/16
USPC ........................... 365/185.11, 185.17, 185.18
See application file for complete search history.

(56) References Cited

U.S. PATENT DOCUMENTS

| | | | | |
|---|---|---|---|---|
| 5,570,315 A | * | 10/1996 | Tanaka et al. ............. | 365/185.22 |
| 7,227,781 B2 | * | 6/2007 | Iizuka ....................... | 365/185.17 |
| 7,889,561 B2 | * | 2/2011 | Aritome et al. ........... | 365/185.18 |

FOREIGN PATENT DOCUMENTS

| | | |
|---|---|---|
| JP | 2010-250926 | 11/2010 |
| JP | 2010-287283 | 12/2010 |

* cited by examiner

*Primary Examiner* — Connie Yoha
(74) *Attorney, Agent, or Firm* — Muncy, Geissler, Olds & Lowe, P.C.

(57) ABSTRACT

A non-volatile semiconductor device includes: memory strings formed by series connection of memory cells respectively connected to word lines, wherein each memory string is connected between a bit line and a source line via first and second select gate transistors; and a control circuit controlling the first and second select gate transistors, such that when voltage of the word line is raised to a predetermined value for data readout from the memory cell, a first status where the first select gate transistor is turned on and the second select gate transistor is turned off and second status where the first select gate transistor is turned off and the second select gate transistor is turned on are generated alternately.

14 Claims, 15 Drawing Sheets

NON-VOLATILE SEMICONDUCTOR MEMORY DEVICE AND READOUT METHOD THEREOF

CROSS REFERENCE TO RELATED APPLICATIONS

This application claims priority of Japanese Patent Application No. 2012-159685, filed on Jul. 18, 2012, the entirety of which is incorporated by reference herein.

BACKGROUND OF THE INVENTION

1. Field of the Invention

The present invention relates to a non-volatile semiconductor memory device (EEPROM), such as a flash memory, and a readout method thereof.

2. Description of the Related Art

It is well-known that a plurality of memory cell transistors (called as "memory cells" in the following descriptions) located between bit lines and source lines are series connected to form a NAND string, and a plurality of such NAND strings are highly integrated to form a NAND type non-volatile semiconductor memory device.

For a standard NAND type non-volatile semiconductor memory device, erasing is performed by applying a high voltage, for example 20V, to a semiconductor substrate and 0V to a word line. Therefore, electrons are drawn out from a floating gate which is an electric charge storage layer formed by, for example poly silicon, to make the threshold value lower than the erasing threshold value (for example –3V). On the other hand, for writing (programming), 0V is applied to the semiconductor substrate and a high voltage, for example 20V, is applied to a control gate. Therefore, electrons are injected from the semiconductor substrate to the floating gate to make the threshold value higher than the writing threshold value (for example 1V). The state of the memory cell having one of the above threshold values can be judged by applying a readout voltage (for example 0V) in between the writing threshold value and the erasing threshold value to the control gate and checking if an electric current flows to the memory cell.

Patent document 1: Japan Patent Application Publication No. 2010-287283;
Patent document 2: Japan Patent Application Publication No. 2010-250926.

FIGS. 8A and 8B are section views of a substrate for explaining the problem concerning boosted electrons in the channel of a conventional NAND type flash EEPROM. FIG. 8C is a timing chart of an operation example for explaining the problem concerning boosted electrons in the channel of the NAND type flash EEPROM of FIG. 8A. In the timing charts of the specification, which show operation examples, each line is labeled to show its voltage.

In a preset phase of a readout process, word lines are set at predetermined voltages VpassR (for example 6V) or Vsel (for example 0.5V) before the setting of a readout process (FIGS. 8A and 8C). First, select gate transistors connected to select gate lines SGD and/or SGS are turned off and bit lines are pre-charged to a predetermined value (about 0.5V~1V). (FIGS. 8A and 8C). Next, in order to reflect the states of the memory cells on the bit line voltage, the select gate transistors connected to the select gate lines SGD and/or SGS are turned on (FIGS. 8B and 8C). At this time, electrons boosted in the substrate 30 flow toward global bit lines GBL and a cell source line SL, and hot electrons 31 are produced in the substrate 30 and injected to the floating gates (FG) (FIG. 8B).

FIGS. 9A and 9B are section views of a substrate for explaining the problem of the case where channel boost of a conventional NAND type flash EEPROM is prevented. FIG. 9C is a timing chart of an operation example for explaining the problem at the time when channel boost of the NAND type flash EEPROM of FIGS. 9A and 9B is prevented.

To prevent channel boost, in the above setup operation for word lines at the voltage VpassR, it is necessary to set both of the select gate lines SGD and SGS to a high level (FIGS. 9A and 41 in 9C), or set all word lines WL and the select gate line SGS to a high level (FIGS. 9B and 42 in 9C). However, in this case, there is a problem where the sensing time required increases. In addition, to prevent electric current from flowing from the global bit lines GBL to the cell source line SL via the memory string, the global bit lines GBL, the select gate line SGD or SGS is necessary to be set at 0V in the setup operation of the word lines WL (42 of FIG. 9C).

The purpose of the invention is to provide a non-volatile semiconductor memory device and a readout method thereof capable of preventing channel boost, preventing current from flowing from the bit lines to the source line, and shortening the sensing time required for data readout.

BRIEF SUMMARY OF THE INVENTION

The first invention provides a non-volatile semiconductor device comprising: a plurality of memory strings formed by series connection of a plurality of memory cells respectively connected to word lines, wherein each of the memory strings is connected between a bit line and a source line via first and second select gate transistors; and a control circuit controlling the first and second select gate transistors, such that when the voltage of the word line is raised to a predetermined value for data readout from the memory cell, a first status where the first select gate transistor is turned on and the second select gate transistor is turned off and second status where the first select gate transistor is turned off and the second select gate transistor is turned on are generated alternately.

In the non-volatile semiconductor device, the control circuit controls the first and second select gate transistors, such that the first status and the second status are generated alternately after a high level voltage is applied to gates of the first and second select gate transistors to turn on both of the first and second select gate transistors.

In the non-volatile semiconductor device, the control circuit controls the first and second select gate transistors, such that a high level voltage is applied to gates of the first and second select gate transistors to turn on both of the first and second select gate transistors, and then the first select gate transistor is turned on and the second select gate transistor is turned off, and then the first status and the second status are generated alternately.

In the non-volatile semiconductor device, the first select gate transistor is a select gate transistor connected to a select gate line SGD of the drain side, and the second select gate transistor is a select gate transistor connected to a select gate line SGS of the source side.

In the non-volatile semiconductor device, the first select gate transistor is a select gate transistor connected to a select gate line SGS of the source side, and the second select gate transistor is a select gate transistor connected to a select gate line SGD of the drain side.

In the non-volatile semiconductor device, the control circuit controls the first and second select gate transistors, such that when the first status and the second status are generated alternately, at least one period when both of the first and second select gate transistors are turned off exists.

In the non-volatile semiconductor device, the control circuit controls the first and second select gate transistors, such that the first status and the second status are generated alternately and repeatedly.

The second invention provides a readout method of a non-volatile semiconductor device, wherein the non-volatile semiconductor device comprises a plurality of memory strings formed by series connection of a plurality of memory cells respectively connected to word lines, wherein each of the memory strings is connected between a bit line and a source line via first and second select gate transistors, and wherein the readout method comprises controlling the first and second select gate transistors, such that when the voltage of the word line is raised to a predetermined value for data readout from the memory cell, a first status where the first select gate transistor is turned on and the second select gate transistor is turned off and second status where the first select gate transistor is turned off and the second select gate transistor is turned on are generated alternately.

In the readout method, the first and second select gate transistors are controlled, such that the first status and the second status are generated alternately after a high level voltage is applied to gates of the first and second select gate transistors to turn on both of the first and second select gate transistors.

In the readout method, the first and second select gate transistors are controlled, such that a high level voltage is applied to gates of the first and second select gate transistors to turn on both of the first and second select gate transistors, and then the first select gate transistor is turned on and the second select gate transistor is turned off, and then the first status and the second status are generated alternately.

In the readout method, the first select gate transistor is a select gate transistor connected to a select gate line SGD of the drain side, and the second select gate transistor is a select gate transistor connected to a select gate line SGS of the source side.

In the readout method, the first select gate transistor is a select gate transistor connected to a select gate line SGS of the source side, and the second select gate transistor is a select gate transistor connected to a select gate line SGD of the drain side.

In the readout method, the first and second select gate transistors are controlled, such that when the first status and the second status are generated alternately, at least one period when both of the first and second select gate transistors are turned off exists.

In the readout method, the first and second select gate transistors are controlled, such that the first status and the second status are generated alternately and repeatedly.

As described above, in comparison with prior art, the invention provides a non-volatile semiconductor memory device and a readout method thereof capable of preventing channel boost, preventing current from flowing from the bit lines to the source line, and shortening the sensing time required for data readout.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Following, embodiments of the invention are described with figures. In the embodiments, the same elements are labeled with the same symbol.

Figure 1:
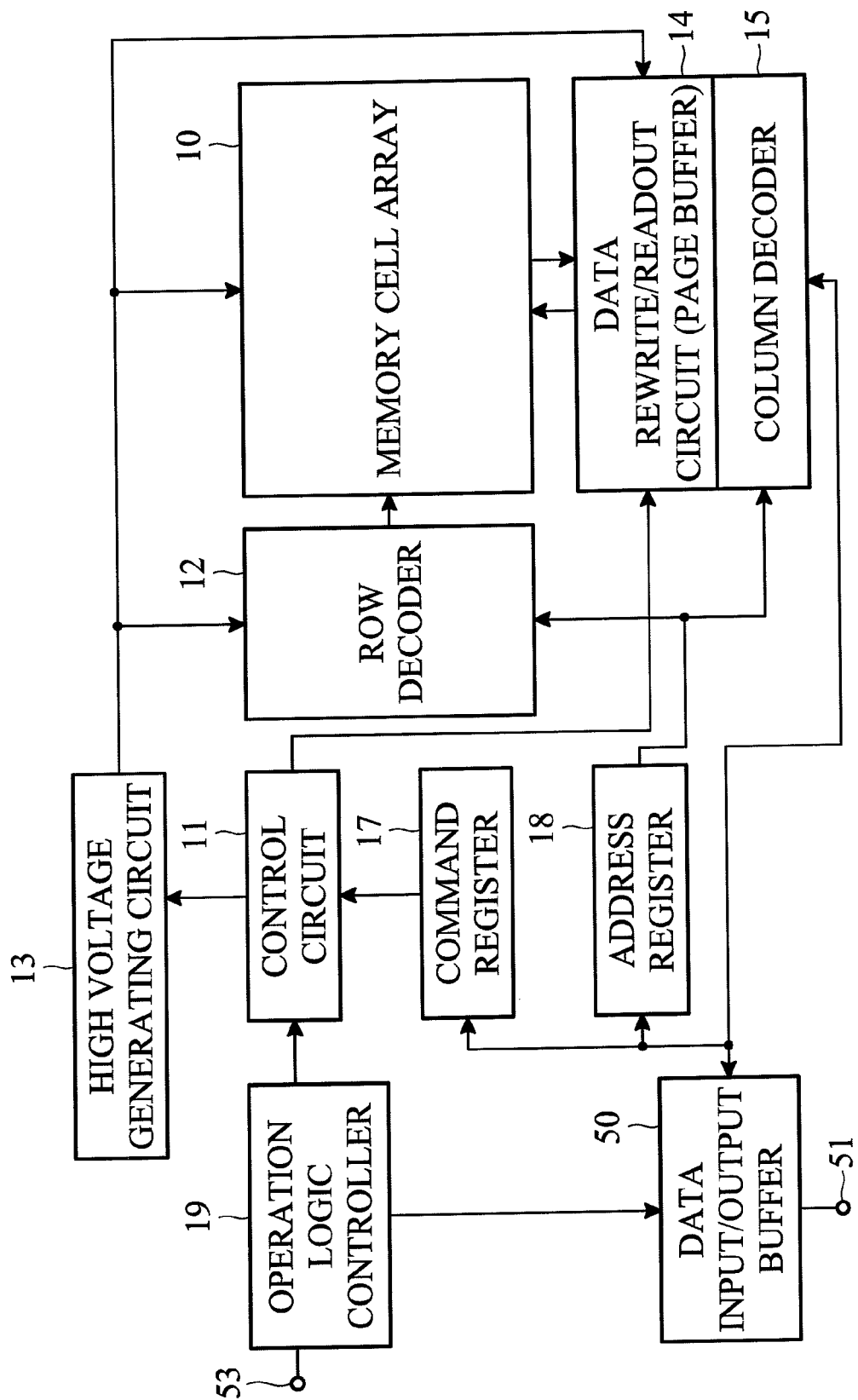
FIG. 1 is a block diagram showing an entire structure of a NAND type flash EEPROM in accordance with an embodiment of the invention.
Figure 2:
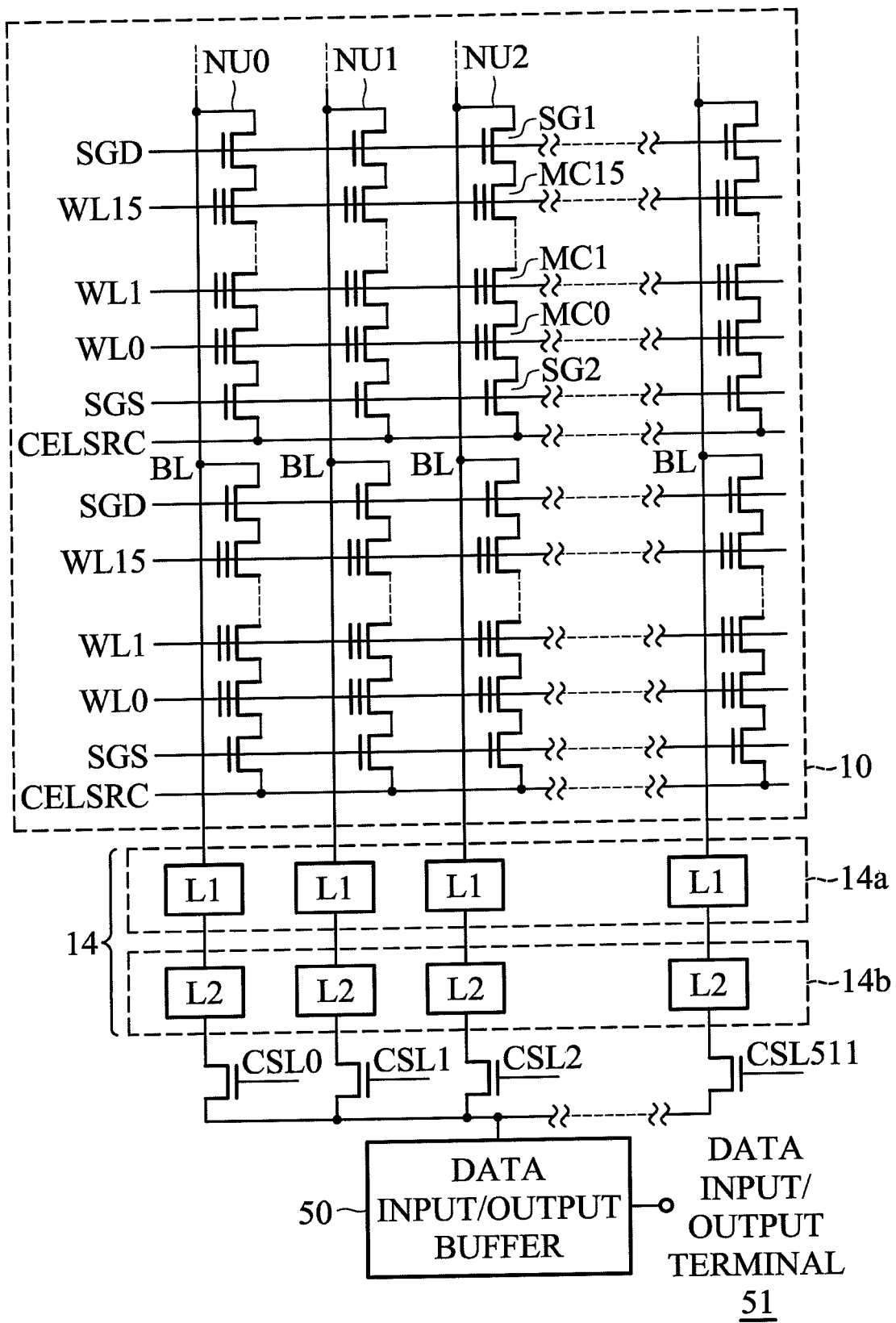
FIG. 2 is a circuit diagram showing the memory cell array 10 and the peripheral circuit of FIG. 1.

FIG. 1 is a block diagram showing an entire structure of a NAND type flash EEPROM in accordance with an embodiment of the invention. FIG. 2 is a circuit diagram showing the memory cell array 10 and the peripheral circuit of FIG. 1. First, the structure of the NAND type flash EEPROM in accordance with the embodiment is described.

In FIG. 1, the NAND type flash EEPROM in accordance with the embodiment comprises a memory cell array 10, a control circuit 11 controlling the operation of the memory cell array 10, a row decoder 12, a high voltage generating circuit 13, a data rewrite/readout circuit 14, a column decoder 15, a command register 17, an address register 18, an operation logic controller 19, a data input/output buffer 50, and a data input/output terminal 51.

The memory cell array 10, as shown in FIG. 2, is constructed by NAND cell units NU (NU0, NU1, . . . ), each of which is formed by series connection of, for example, 16 stacked gate structured electrical rewritable non-volatile memory cells MC0~MC15. Each NAND cell unit NU, at its drain side, is connected to a bit line BL via a select gate transistor SG1, and at its source side, is connected to a common source line CELSRC via a select gate transistor SG2. The memory cells arranged in a row has a control gate connected to a word line WL commonly. The gate electrodes of the select gate transistors SG1 and SG2 are respectively connected select gate lines SGD and SGS which are arranged parallel with the word lines WL. A range of the memory cells selected by the one word line WL is called one page which is a unit for writing and readout. A range of a plurality of NAND cell units NU of a page or its integer multiples is called a block which is a unit for data erasing. To perform data writing and readout with a page unit, the data rewrite/readout circuit 14 comprises a sense amplifier circuit SA and a latch circuit DL, which are arranged for each bit line. The sense amplifier circuit SA and the latch circuit DL are called a page buffer in the following descriptions.

The memory cell 10 of FIG. 2 has a simplified structure, wherein a page buffer can be shared by a plurality of bit lines. In this case, the number of the bit lines selectively connected to the page buffer in the data writing or readout operation corresponds to a page.

FIG. 2 shows a range of a cell array where data input/output is performed with an input/output terminal 51. The row decoder 12 and the column decoder 15 are respectively arranged to select a word line WL and a bit line BL of the memory cell array 10. The control circuit 11 performs sequence control of data writing, erasing, and readout. The high voltage generating circuit 13 controlled by the control circuit 11 generates a boosted high voltage or medium voltages for data writing, erasing, and readout.

The input/output buffer 50 is used for input/output of data and input of address signals. Namely, data is transferred between the input/output terminal 51 and the page buffer 14 via the input/output buffer 50 and the data line 52. The address signal input from the input/output terminal 51 is held by the address register 18 and transferred to the row decoder 12 and the column decoder 15 to be decoded. Commands for operation control are also input from the input/output terminal 51. The input command is decoded and held by the command register 17, such that the control circuit 11 is controlled. External control signals, such as a chip enable signal CEB, command latch enable signal CLE, address latch enable signal ALE, writing enable signal WEB, and readout enable signal REB, are loaded in the operation logic controller 19, and therefore internal control signals are generated according to operation modes. The inner control signal is used for control of a data latch or transfer of the input/output buffer 50, and transferred to the control circuit 11 to perform operation control.

The page buffer 14 has 2 latch circuits 14a and 14b capable of switching between a multi-value operation function and cache function and performing the functions. Namely, in the case where a 2-value data of 1 bit is stored in a memory cell, the page buffer 14 has the cache function. In the case where a 4-value data of 2 bit is stored in a memory cell, the page buffer 14 can has the cache function or activate the cache function even though it is limited by the address.

Figure 3:
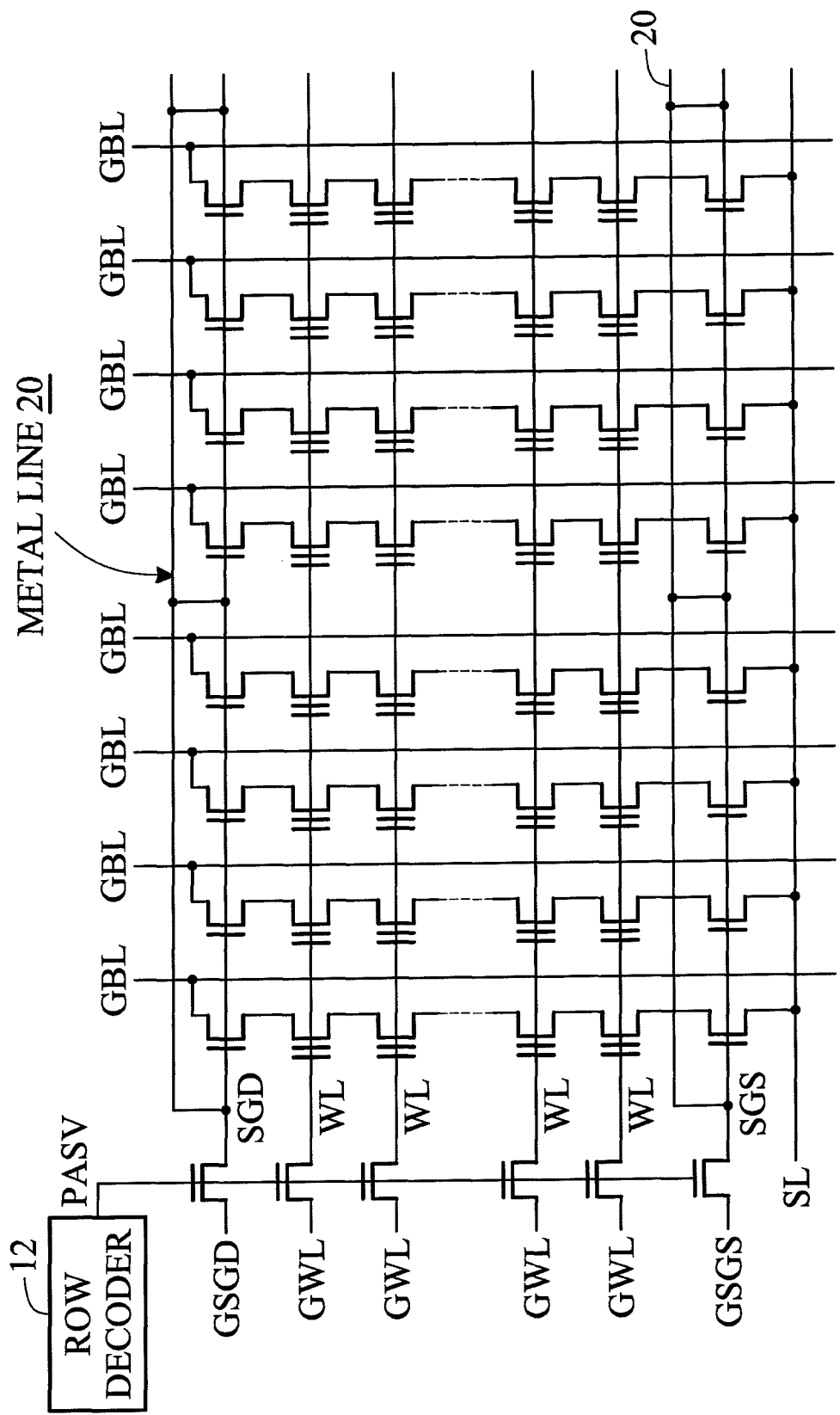
FIG. 3 is a circuit diagram for explaining the background technique of the readout method of the NAND type flash EEPROM in accordance with an embodiment of the invention, and also a circuit diagram showing an example of the structure of the memory cell array 10 and the peripheral circuit of FIG. 1.
Figure 4:
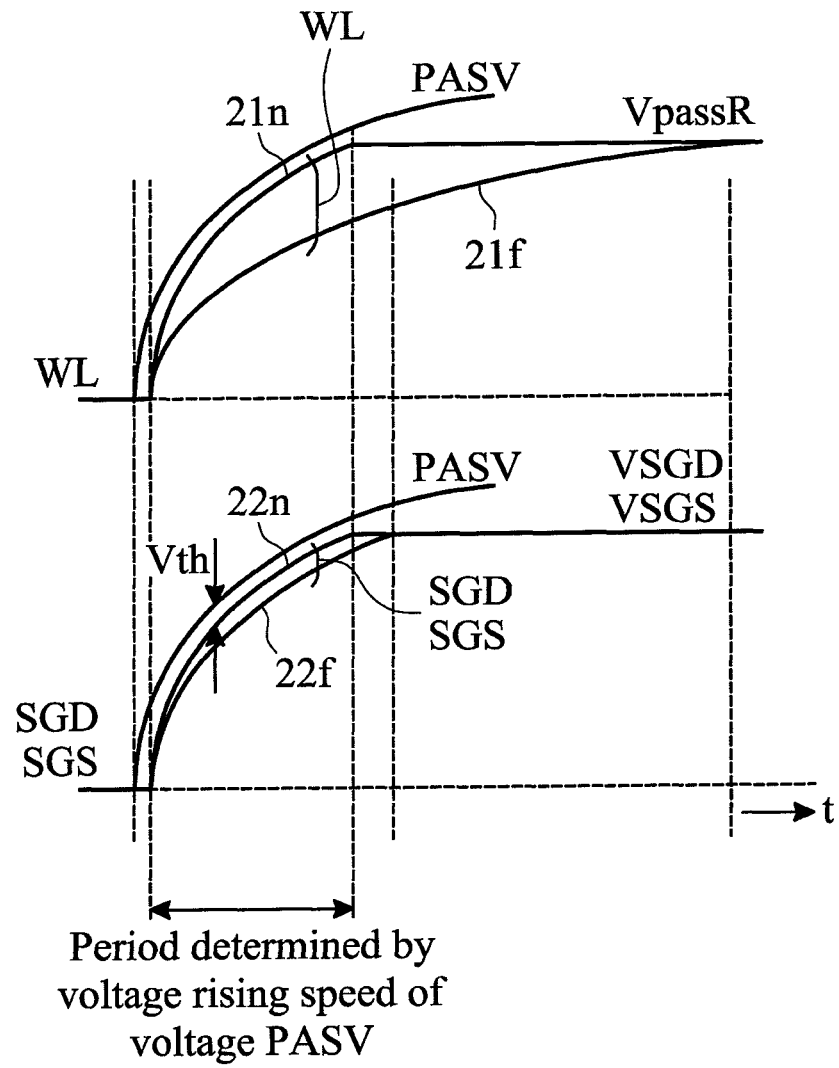
FIG. 4 is a timing chart showing operations for explaining the background technique of the readout method of the NAND type flash EEPROM in accordance with an embodiment of the invention.

FIG. 3 is a circuit diagram for explaining the background technique of the readout method of the NAND type flash EEPROM in accordance with an embodiment of the invention. FIG. 3 is also a circuit diagram showing an example of the structure of the memory cell array 10 and the peripheral circuit of FIG. 1. FIG. 4 is a timing chart showing operations for explaining the background technique of the readout method of the NAND type flash EEPROM in accordance with an embodiment of the invention. In FIG. 3, GBL is a global bit line, GWL is a global word line, and GSGD and GSGS are global selecting lines.

In such NAND type flash EEPROM, as shown in FIG. 4, the speeds of boosting the voltage of the word line WL and the select gate lines SGD and SGS are limited by the row selecting voltage supplied from the row decoder 12, for example, the voltage PASV of a certain number of microseconds. Namely, the voltage of the word line WL is located between 21n and 21f in FIG. 4, and the voltages of the select gate lines SGD and SGS are located between 22n and 22f in FIG. 4. Further, as shown in FIG. 3, the select gate lines SGD and SGS are shunted by metal lines 20. As a result, the CR delay time thereof is much shorter than voltage boosting delay time of the voltage PASV. For example, the voltage boosting delay time of the voltage PASV is about 5 microseconds and the CR delay time of the select gate lines SGD and SGS is about 0.5 microseconds. Note that the select gate lines SGD are select gate lines at the bit line side (drain side), and the select gate lines SGS are select gate lines at the source line side (source side).

Figure 5:
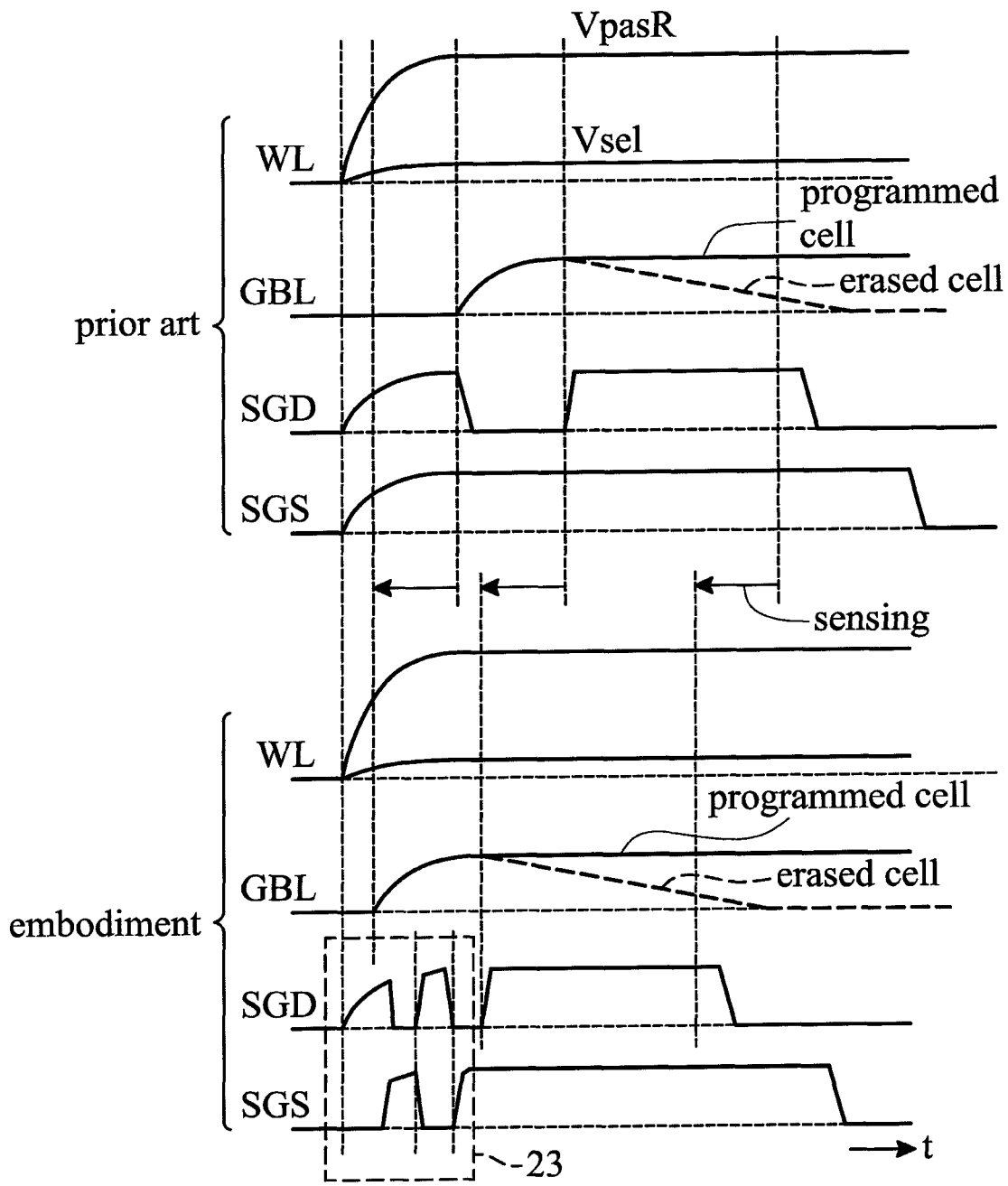
FIG. 5 is a timing chart showing operations for explaining the basic concept of the readout method of the NAND type flash EEPROM in accordance with an embodiment of the invention.

FIG. 5 is a timing chart showing operations for explaining the basic concept of the readout method of the NAND type flash EEPROM in accordance with an embodiment of the invention. The upper part of FIG. 5 shows a timing chart in accordance with prior art for comparison. In the data readout method in accordance with the embodiment of the invention, the feature of the control circuit 11 is generating control voltages as described below.

In a setup period for word lines WL when the voltage of the word lines is raised to a predetermined readout voltage VpassR and the global bit lines GBL are pre-charged, voltages of the select gate lines SGD and SGS are generated so that a status A and a status B alternately happen as shown by 23 of FIG. 5.

(Status A) the gate of the select gate MOS transistor (called as select gate transistor here forward) connected to the select gate line SGD is applied with a high level voltage, for example 5V, to turn on the select gate transistor, and the gate of the select gate transistor connected to the select gate line SGS is applied with a low level voltage, for example 0V, to turn off the select gate transistor.

(Status B) the gate of the select gate transistor connected to the select gate line SGD is applied with a low level voltage, for example 0V, to turn off the select gate transistor, and the gate of the select gate transistor connected to the select gate line SGS is applied with a high level voltage, for example 5V, to turn off the select gate transistor.

Figure 9A:
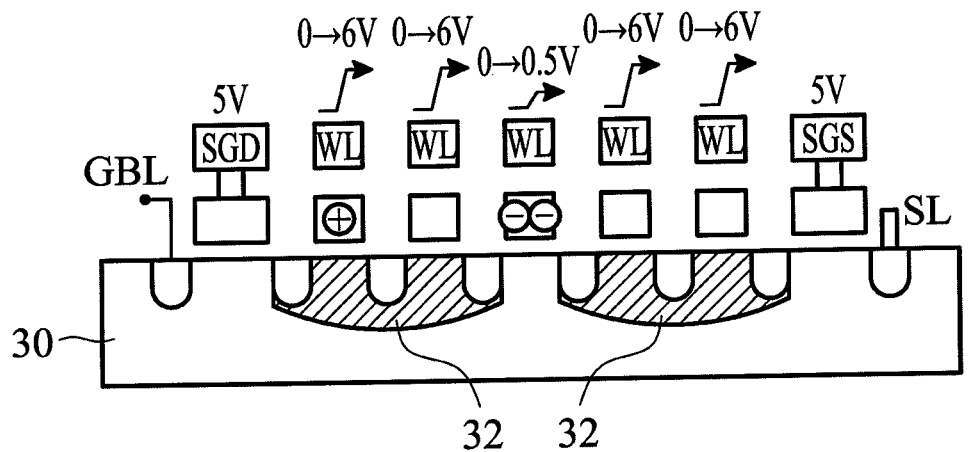
FIG. 9A is a section view of a substrate for explaining the problem of the case where channel boost of a conventional NAND type flash EEPROM is prevented.
Figure 9B:
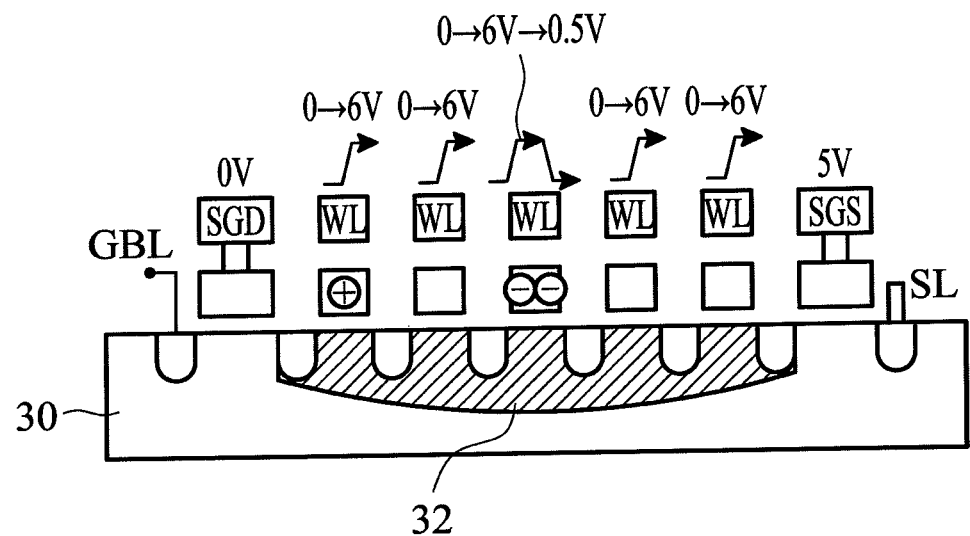
FIG. 9B is section view of a substrate for explaining the problem of the case here channel boost of a conventional NAND type flash EEPROM is prevented.
Figure 9C:
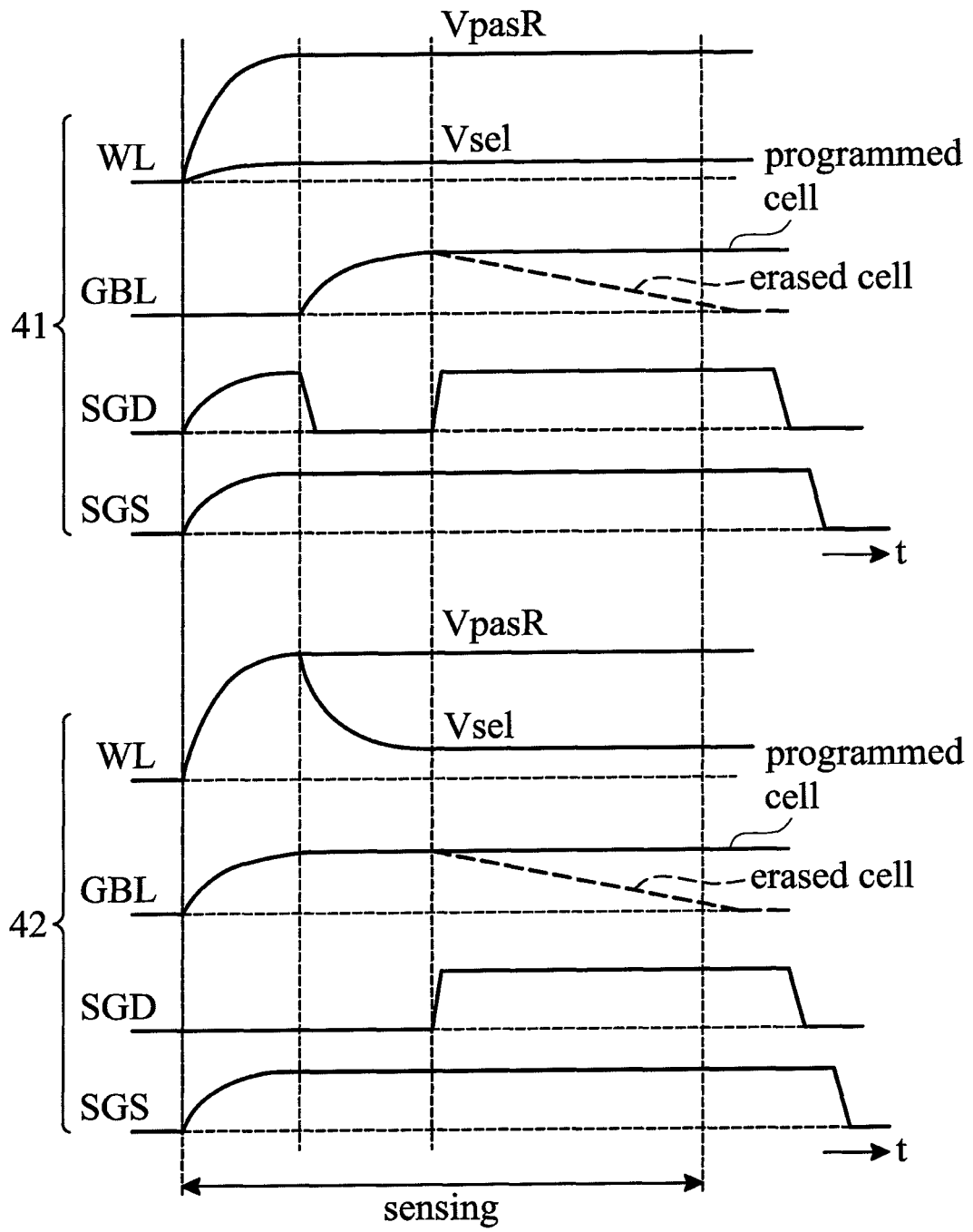
FIG. 9C is a timing chart of an operation example for explaining the problem at the time when channel boost of the NAND type flash EEPROM of FIGS. 9A and 9B is prevented.

Because at least one of the select gate transistor connected to the select gate line SGD and the select gate transistor connected to the select gate line SGS is turned off, the current of the global bit line does not flow to the source line through the memory string. However, on the other hand, because the select gate transistor connected to the select gate line SGD or the select gate transistor connected to the select gate line SGS is turned on, boosted electrons flow out as shown in FIG. 9A. Here, because the select gate transistor connected to the select gate line SGD or the select gate transistor connected to the select gate line SGS is turned on repeatedly, the channel boost is constrained and a voltage level enough for generating hot electrons can not be reached.

After the setup period for word lines WL when the voltage of the word lines is raised to a predetermined readout voltage VpassR and the global bit lines are pre-charged, it can be determined that data is stored in the memory cell if the global bit lines is kept at a high level; otherwise, it can be determined that data has been erased from the memory cell if the voltage of the global bit lines is lower than low level. Therefore, data of the memory cell can be readout.

As described above, according to the embodiment, as shown in FIG. 5, channel boost is prevented and current is prevented from flowing from the bit lines to the source line, and at the same time the sensing time of data readout is shortened.

Figure 6A:
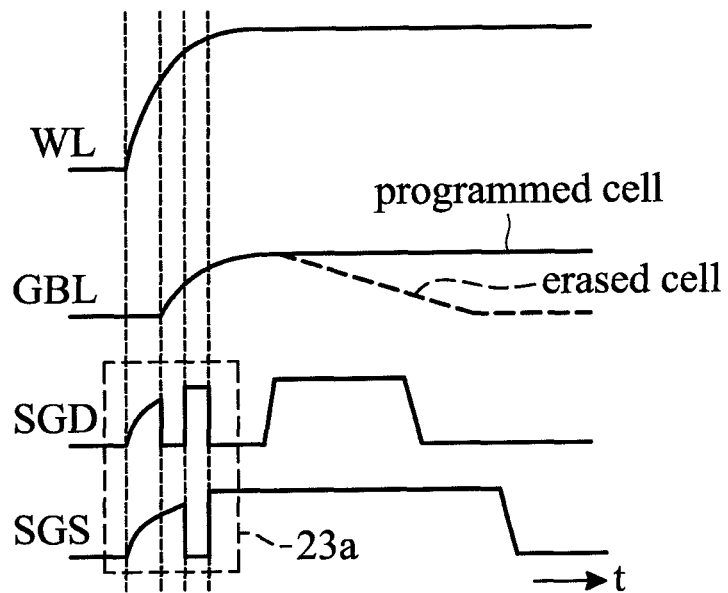
FIG. 6A is a timing chart showing an operation of the readout method of the NAND type flash EEPROM in accordance with Embodiment 1 of the invention.
Figure 6B:
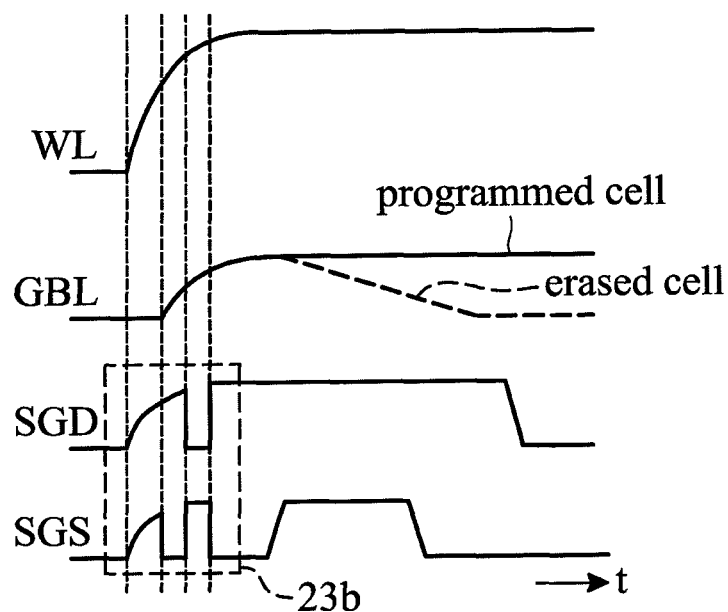
FIG. 6B is a timing chart showing an operation of the readout method of the NAND type flash EEPROM in accordance with Embodiment 2 of the invention.
Figure 6C:
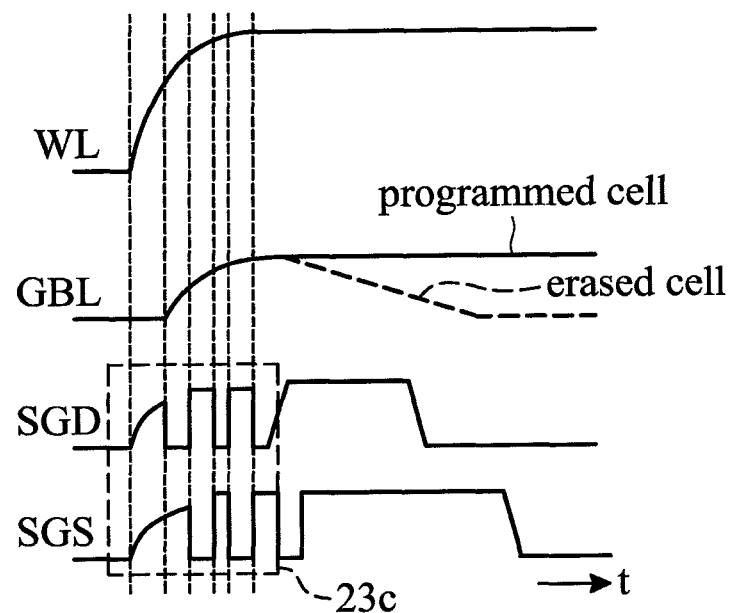
FIG. 6C is a timing chart showing an operation of the readout method of the NAND type flash EEPROM in accordance with Embodiment 3 of the invention.

Following, a plurality of embodiments of generating voltages of the select gate lines SGD and SGS are described by referring to FIGS. 6A-6C. As shown in FIGS. 6A-6C, the initial pulse voltage of the select gate lines SGD and SGS starts from a voltage rising to a high level. After that, the select gate transistors connected to the select gate lines SGD and SGS are applied with gate voltages for being turned on and off alternately.

Embodiment 1:

FIG. 6A is a timing chart showing an operation of the readout method of the NAND type flash EEPROM in accordance with an embodiment of the invention. In 23a of FIG. 6A, the initial pulse voltage of the select gate lines SGD and SGS starts from a voltage and rises to a high level. After that, the select gate transistor connected to the select gate lines SGD is turned off. Next, the select gate transistor connected to the select gate lines SGD is turned on and the select gate transistor connected to the select gate lines SGS is turned off. Next, the select gate transistor connected to the select gate lines SGD is turned off and the select gate transistor connected to the select gate lines SGS is turned on.

Figure 8A:
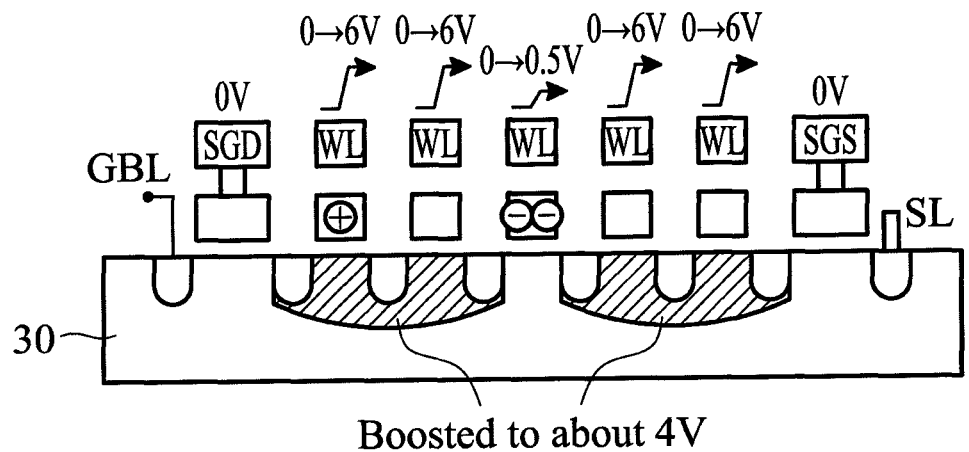
FIG. 8A is a section view of a substrate for explaining the problem concerning boosted electrons in the channel of a conventional NAND type flash EEPROM.
Figure 8B:
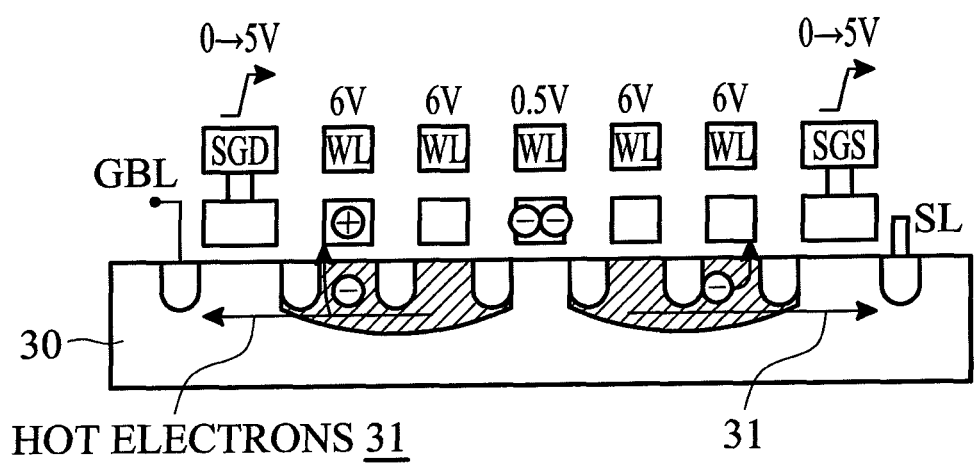
FIG. 8B is a section view of a substrate for explaining the problem concerning boosted electrons in the channel of the NAND type flash EEPROM of FIG. 8A.
Figure 8C:
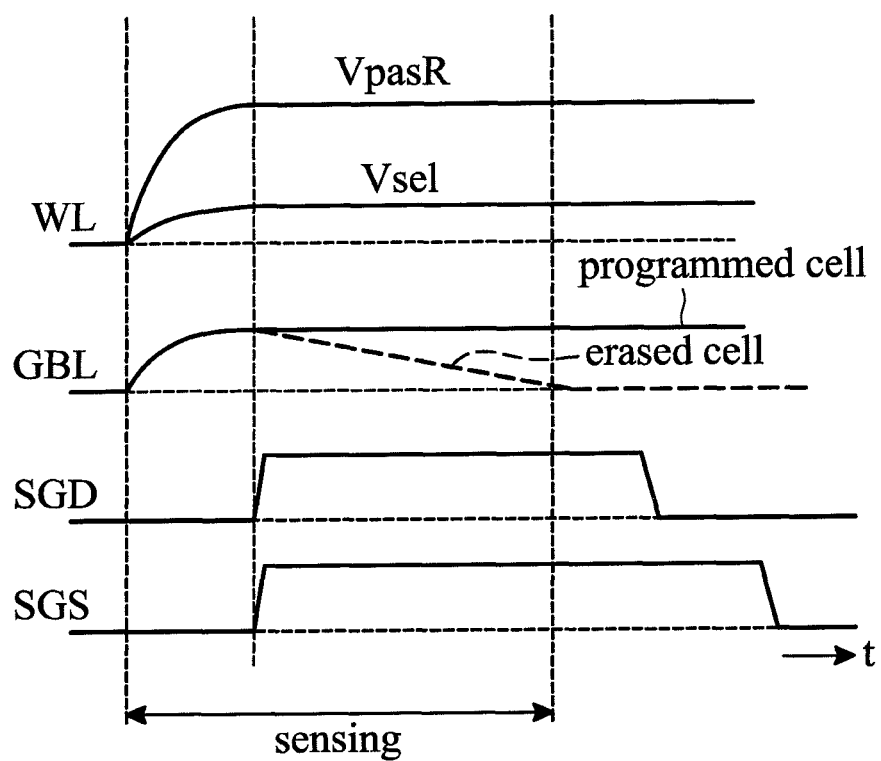
FIG. 8C is a timing chart of an operation example for explaining the problem concerning boosted electrons in the channel of the NAND type flash EEPROM of FIG. 8A.

Here, when the voltage of the word line starts to rise, the voltage rising speed is fast. For example, if the voltage of the word line takes 5 microseconds to reach 95% of PASV of FIG. 4, this means that the voltage has risen 63% at the timing of 1.7 microseconds. Therefore, the initial pulse voltage of the select gate lines SGD and SGS starting from a voltage rising to a high level is for immediately turning on both of the select gate transistors to let the boosted charges flow out right after the voltage of the word line WL is raised. After the voltage of the word line starts to rise, the situation of FIG. 8B may are generated during the period when one of the select gate lines SGD and SGS is given an OFF voltage. However, those voltages need some time to reach enough of a voltage level because the voltage rising speed is limited by the PASV.

Embodiment 2:

FIG. 6B is a timing chart showing an operation of the readout method of the NAND type flash EEPROM in accordance with another embodiment of the invention. In 23b of FIG. 6B, the initial pulse voltage of the select gate lines SGD and SGS starts from a voltage rising to a high level. After that, the select gate transistor connected to the select gate lines SGS is turned off. Next, the select gate transistor connected to the select gate lines SGD is turned off and the select gate transistor connected to the select gate lines SGS is turned on. Next, the select gate transistor connected to the select gate lines SGD is turned on and the select gate transistor connected to the select gate lines SGS is turned off.

Embodiment 3:

FIG. 6C is a timing chart showing an operation of the readout method of the NAND type flash EEPROM in accordance with another embodiment of the invention. In 23c of FIG. 6C, the initial pulse voltage of the select gate lines SGD and SGS starts from a voltage rising to a high level. After that, the select gate transistor connected to the select gate lines SGD is turned off. Next, the select gate transistor connected to the select gate lines SGD is turned on and the select gate transistor connected to the select gate lines SGS is turned off. Next, the select gate transistor connected to the select gate lines SGD is turned off and the select gate transistor connected to the select gate lines SGS is turned on. Further, the above operations are repeatedly performed. In Embodiment 3, the period of control pulse for turning on/off the select gate transistor is shorter than those in Embodiments 1 and 2. At the same time, in Embodiment 3, the number of control pulses for turning on/off the select gate transistor is more than those in Embodiments 1 and 2.

Figure 7A:
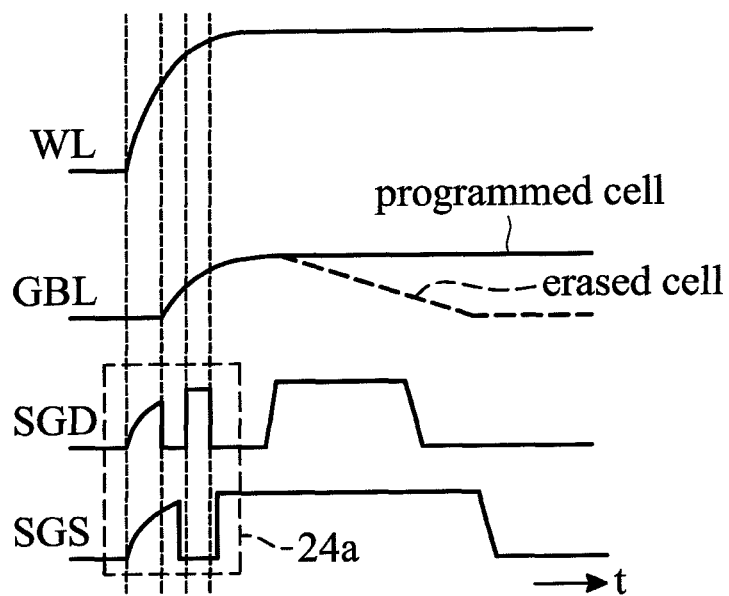
FIG. 7A is a timing chart showing an operation of the readout method of the NAND type flash EEPROM in accordance with a modification of Embodiment 1 of the invention.

Modification of Embodiment 1:

FIG. 7A is a timing chart showing an operation of the readout method of the NAND type flash EEPROM in accordance with a modification of Embodiment 1 of the invention. In comparison with Embodiment 1 of FIG. 6A, the period when a pulse of a low level is applied to the gate of the select gate transistor via the select gate line SGS is set to be longer than the period when a pulse of a high level is applied to the gate of the select gate transistor via the corresponding select gate line SGD. Periods when the select gate transistor is connected to the select gate lines SGD and the select gate transistor connected is to the select gate lines SGS are both turned off can be prepared (24a of FIG. 7A).

Figure 7B:
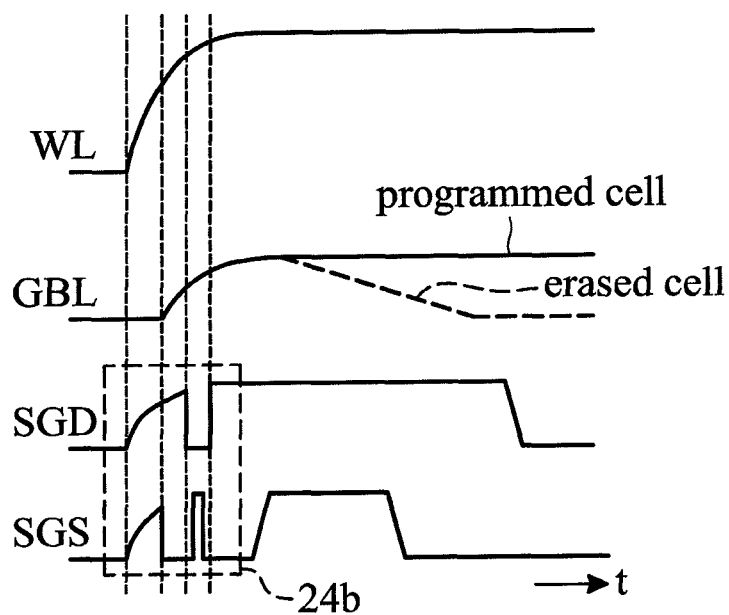
FIG. 7B is a timing chart showing an operation of the readout method of the NAND type flash EEPROM in accordance with a modification of Embodiment 2 of the invention.

Modification of Embodiment 2:

FIG. 7B is a timing chart showing an operation of the readout method of the NAND type flash EEPROM in accordance with a modification of Embodiment 2 of the invention. In comparison with Embodiment 2 of FIG. 6B, the period when a pulse of a high level is applied to the gate of the select gate transistor via the select gate line SGS is set to be shorter than the period when a pulse of a low level is applied to the gate of the select gate transistor via the corresponding select gate line SGD. Periods when the select gate transistor connected to the select gate lines SGD and the select gate transistor connected to the select gate lines SGS are both turned off can be prepared (24b of FIG. 7B).

Figure 7C:
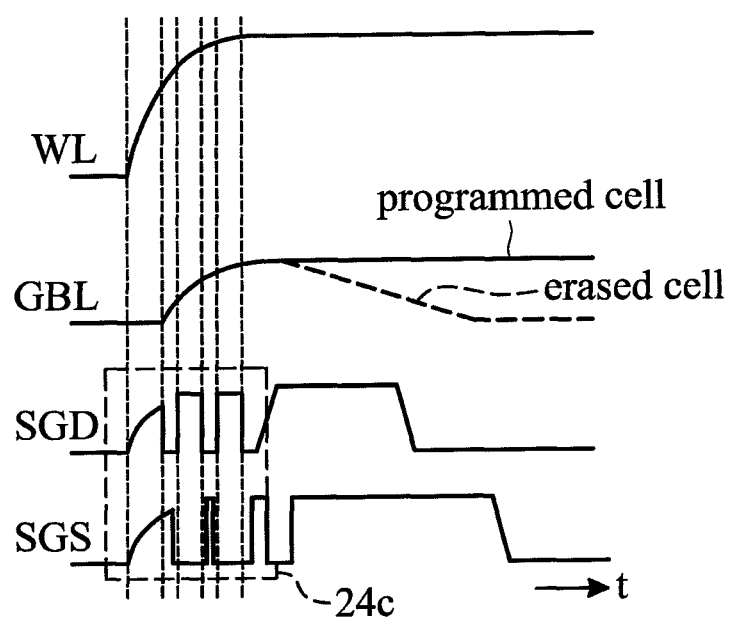
FIG. 7C is a timing chart showing an operation of the readout method of the NAND type flash EEPROM in accordance with a modification of Embodiment 3 of the invention.

Modification of Embodiment 3:

FIG. 7C is a timing chart showing an operation of the readout method of the NAND type flash EEPROM in accordance with a modification of Embodiment 3 of the invention. In comparison with Embodiment 3 of FIG. 6C, the period when a pulse of a low level is applied to the gate of the select gate transistor via the select gate line SGS is set to be longer than the period when a pulse of a high level is applied to the gate of the select gate transistor via the corresponding select gate line SGD, and the period when a pulse of a high level is applied to the gate of the select gate transistor via the select gate line SGS is set to be shorter than the period when a pulse of a low level is applied to the gate of the select gate transistor via the corresponding select gate line SGD. Periods when the select gate transistor connected to the select gate lines SGD and the select gate transistor connected to the select gate lines SGS are both turned off can be prepared (24*c* of FIG. 7C).

According to the above embodiments, because the select gate transistor connected to the select gate lines SGD and the select gate transistor connected to the select gate lines SGS are turned on alternately, channel boost is constrained and a voltage level enough for preventing hot electrons can be reached. Therefore, as shown in FIG. 5, in comparison with prior art, channel boost is prevented and current is prevented from flowing from the bit lines to the source line, and at the same time the sensing time of data readout is shortened.

Modification:

In the above embodiments, a NAND type flash EEPROM is described, but the invention is not limited thereto. The invention can be widely used for non-volatile semiconductor memory devices capable of writing data to floating gates, such as NOR type flash EEPROMs etc.

Figure 10:
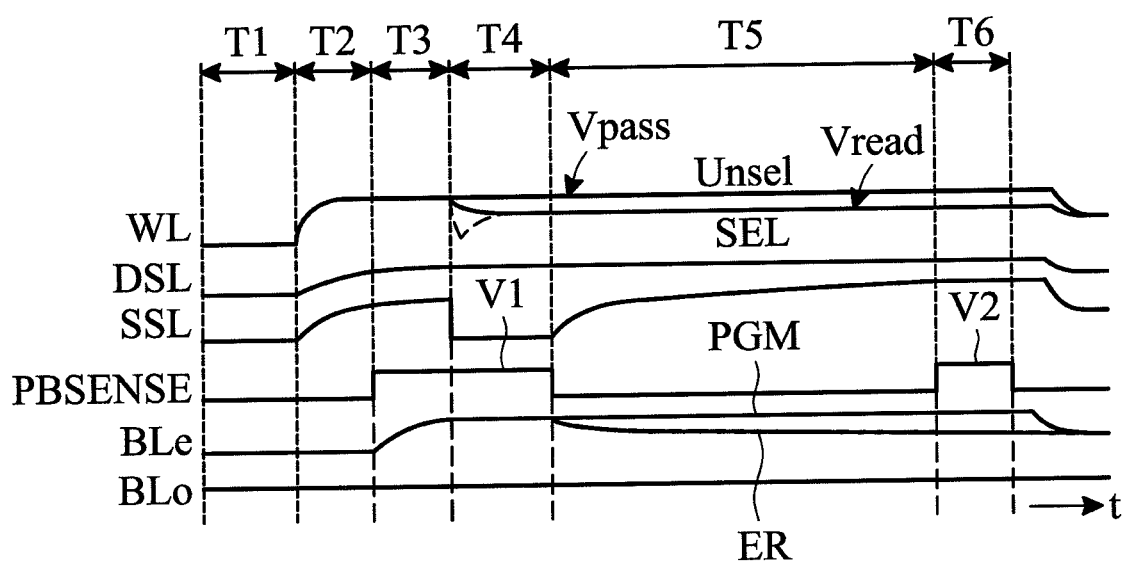
FIG. 10 is a timing chart showing an operation of the NAND type flash EEPROM in accordance with a first conventional example of Patent document 1.

Differences Between the First Conventional Example and the Invention:

FIG. 10 is a timing chart showing an operation of the NAND type flash EEPROM in accordance with a first conventional example of Patent document 1. In FIG. 10, all word lines are set at a predetermined voltage Vpass, and the select lines SGD and SGS are set at high levels. At this time, after the bit line BL is pre-charged to a pre-charge level, electric current flows to the bit line BL and data readout is performed. However, Patent document 1 doesn't disclose that the select gate transistor connected to the select gate line SGD or the select gate transistor connected to the select gate line SGS is turned on alternately, as the invention does. Furthermore, at timing T3, the bit line BLe is pre-charged, all word lines are at a high level Vpass, and the select gate lines DSL and SSL are both at high levels. Therefore, electric current flows from the bit line to the source line such that one purpose of the invention, cutting the electric current of the bit line, cannot be achieved.

Figure 11:
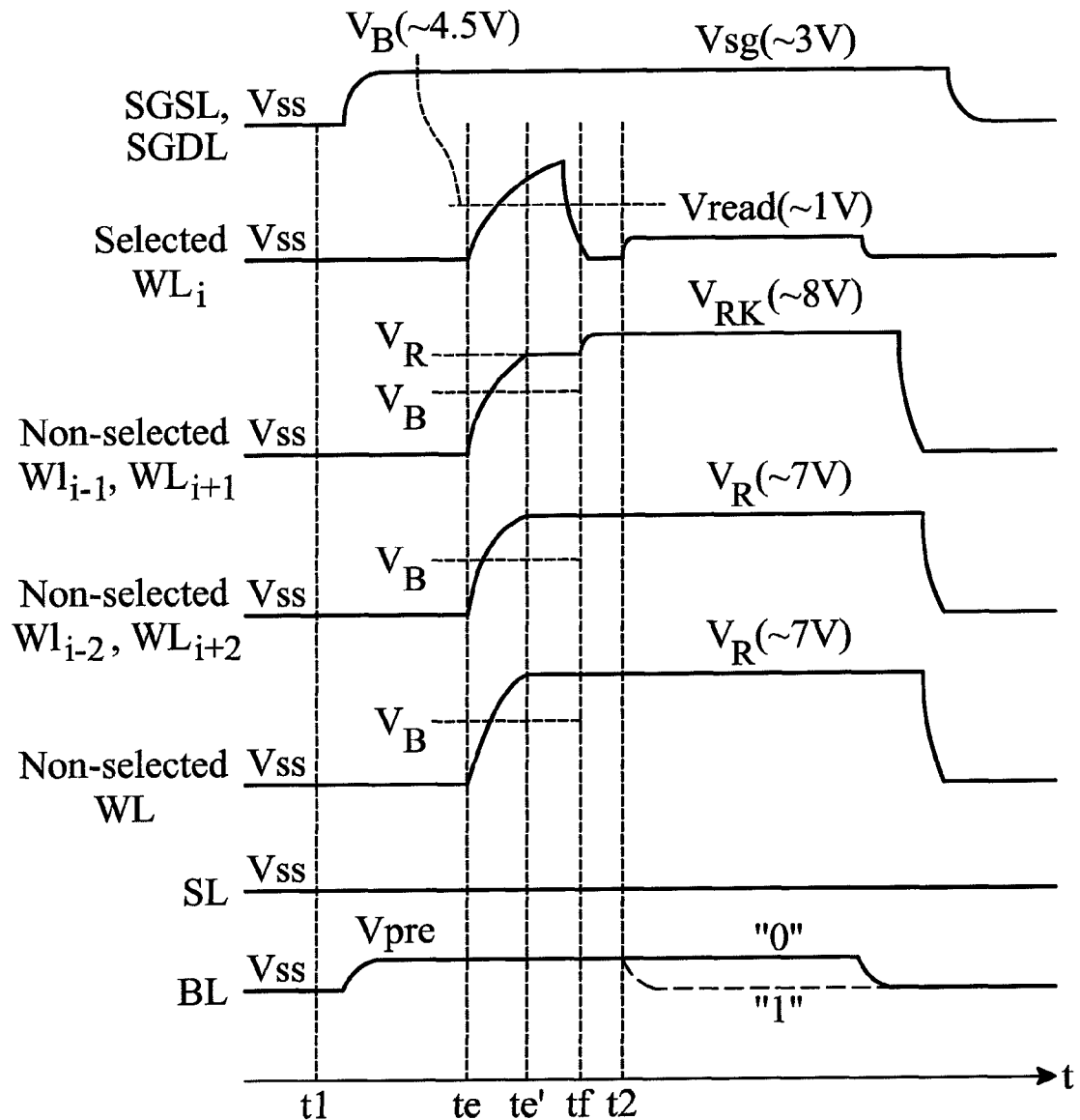
FIG. 11 is a timing chart showing an operation of the NAND type flash EEPROM in accordance with a second conventional example of Patent document 2.

Differences Between the Second Conventional Example and the Invention:

FIG. 11 is a timing chart showing an operation of the NAND type flash EEPROM in accordance with a second conventional example of Patent document 2. In FIG. 11, in the voltage boost setting operation where the voltages of the word lines are to be raised to a predetermined value, data readout is performed after the word lines and the select gate lines SGS and SGD are set at high levels. However, Patent document 2 doesn't disclose that the select gate transistor connected to the select gate line SGD or the select gate transistor connected to the select gate line SGS is turned on alternately, as the invention does. Furthermore, during the period te~tf, the bit line BL is pre-charged, all word lines are at high levels (higher than VB), and the select gate lines SGDL and SGSL are both at high level. Therefore, electric current flows from the bit line to the source line such that one purpose of the invention, cutting the electric current of the bit line, cannot be achieved.

As described above, in comparison with prior art, the invention provides a non-volatile semiconductor memory device and a readout method thereof capable of preventing channel boost, preventing current from flowing from the bit lines to the source line, and decreasing the sensing time required for data readout.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A non-volatile semiconductor device comprising:
a plurality of memory strings formed by series connection of a plurality of memory cells respectively connected to word lines, wherein each of the memory strings is connected between a bit line via a first select gate transistor and a source line via a second select gate transistor; and
a control circuit controlling the first and second select gate transistors, such that when the voltage of the word line is raised to a predetermined value for data readout from the memory cell, a first status where the first select gate transistor is turned on and the second select gate transistor is turned off and second status where the first select gate transistor is turned off and the second select gate transistor is turned on are generated alternately.

2. The non-volatile semiconductor device as claimed in claim 1, wherein the control circuit controls the first and second select gate transistors, such that the first status and the second status are generated alternately after a high level voltage is applied to gates of the first and second select gate transistors to turn on both of the first and second select gate transistors.

3. The non-volatile semiconductor device as claimed in claim 1, wherein the control circuit controls the first and second select gate transistors, such that a high level voltage is applied to gates of the first and second select gate transistors to turn on both of the first and second select gate transistors, and then the first select gate transistor is turned on and the second select gate transistor is turned off, and then the first status and the second status are generated alternately.

4. The non-volatile semiconductor device as claimed in claim 1, wherein the first select gate transistor is a select gate transistor connected to a select gate line SGD of the drain side, and the second select gate transistor is a select gate transistor connected to a select gate line SGS of the source side.

5. The non-volatile semiconductor device as claimed in claim 1, wherein the first select gate transistor is a select gate transistor connected to a select gate line SGS of the source side, and the second select gate transistor is a select gate transistor connected to a select gate line SGD of the drain side.

6. The non-volatile semiconductor device as claimed in claim 1, wherein the control circuit controls the first and second select gate transistors, such that when the first status and the second status are generated alternately, at least one period when both of the first and second select gate transistors are turned off exists.

7. The non-volatile semiconductor device as claimed in claim 1, wherein the control circuit controls the first and second select gate transistors, such that the first status and the second status are generated alternately and repeatedly.

8. A readout method of a non-volatile semiconductor device, wherein the non-volatile semiconductor device comprises a plurality of memory strings formed by series connection of a plurality of memory cells respectively connected to word lines, wherein each of the memory strings is connected between a bit line via a first select gate transistor and a source line via a second select gate transistor, and
wherein the readout method comprises
controlling the first and second select gate transistors, such that when the voltage of the word line is raised to a predetermined value for data readout from the memory cell, a first status where the first select gate transistor is turned on and the second select gate transistor is turned off and second status where the first select gate transistor is turned off and the second select gate transistor is turned on are generated alternately.

9. The readout method as claimed in claim 8, wherein the first and second select gate transistors are controlled, such that the first status and the second status are generated alternately after a high level voltage is applied to gates of the first and second select gate transistors to turn on both of the first and second select gate transistors.

10. The readout method as claimed in claim 8, wherein the first and second select gate transistors are controlled, such that a high level voltage is applied to gates of the first and second select gate transistors to turn on both of the first and second select gate transistors, and then the first select gate transistor is turned on and the second select gate transistor is turned off, and then the first status and the second status are generated alternately.

11. The readout method as claimed in claim 8, wherein the first select gate transistor is a select gate transistor connected to a select gate line SGD of the drain side, and the second select gate transistor is a select gate transistor connected to a select gate line SGS of the source side.

12. The readout method as claimed in claim 8, wherein the first select gate transistor is a select gate transistor connected to a select gate line SGS of the source side, and the second select gate transistor is a select gate transistor connected to a select gate line SGD of the drain side.

13. The readout method as claimed in claim 8, wherein the first and second select gate transistors are controlled, such that when the first status and the second status are generated alternately, at least one period when both of the first and second select gate transistors are turned off exists.

14. The readout method as claimed in claim 8, wherein the first and second select gate transistors are controlled, such that the first status and the second status are generated alternately and repeatedly.

\* \* \* \* \*